United States Patent
Kasahara

(12) 
(10) Patent No.: US 6,337,644 B1
(45) Date of Patent: Jan. 8, 2002

(54) CONSTANT-CURRENT GENERATION CIRCUIT, DIGITAL/ANALOG CONVERSION CIRCUIT, AND IMAGE PROCESSOR

(75) Inventor: Shoichiro Kasahara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/486,053

(22) PCT Filed: Jun. 25, 1999

(86) PCT No.: PCT/JP99/03439

§ 371 Date: Feb. 22, 2000

§ 102(e) Date: Feb. 22, 2000

(87) PCT Pub. No.: WO99/67884

PCT Pub. Date: Dec. 29, 1999

(30) Foreign Application Priority Data

Jun. 25, 1998 (JP) .............................. 10-179278

(51) Int. Cl.⁷ ................................................ H03M 1/66
(52) U.S. Cl. ...................... 341/136; 341/144; 323/315
(58) Field of Search ................................ 341/136, 144, 341/153; 323/315

(56) References Cited

U.S. PATENT DOCUMENTS 5,838,271 A * 11/1998 Park ............................ 341/144
5,949,362 A * 9/1999 Tesch et al. ................ 341/144

FOREIGN PATENT DOCUMENTS

| JP | 2-76259 | 3/1990 |
|---|---|---|
| JP | 5-267354 | 10/1993 |
| JP | 5-308288 | 11/1993 |
| JP | 7-193500 | 7/1995 |

OTHER PUBLICATIONS

IBM Technical Disclosure Bulletin, Digital–to–Analog Converter N Bits + Sign, With Complementary CMOS Current Source, on Gate Arrays;Sep. 1986 vol. 29 No. 4.*

* cited by examiner

Primary Examiner—Howard L. Williams
(74) Attorney, Agent, or Firm—Oliff & Berridge PLC

(57) ABSTRACT

A constant-current generating circuit for implementing high-precision analog output is disclosed in an image processing apparatus that includes a digital-to-analog conversion circuit (DAC) for converting a digital data image signal into analog data. For stably generating a constant current, current-generating transistors formed of basic-capacitance transistors are regularly disposed in the form of a SEA OF GATES (SOG). With this arrangement, uniform pattern formation based on the basic-capacitance transistors can be achieved, so that all the factors of the constant-current generating circuit, such as the drain resistance, the source resistance, etc., can be made uniform, thereby stably generating a constant current. The whole constant-current generating circuit group forming the digital-to-analog conversion circuit becomes totally independent due to the above-described arrangement, thereby stabilizing a constant current within one channel.

7 Claims, 6 Drawing Sheets

CONSTANT-CURRENT GENERATION CIRCUIT, DIGITAL/ANALOG CONVERSION CIRCUIT, AND IMAGE PROCESSOR

BACKGROUND OF THE INVENTION

1. Field of the Invention

The present invention relates to an image processing apparatus, such as a fast video graphic controller for use in a digital television, a graphic display, etc., or a VGA-, SVGA-, or XGA-compatible video projector graphic controller. More particularly, the invention relates to a digital-to-analog conversion circuit built in the above type of image processing apparatus, i.e., to a structure of a semiconductor apparatus for implementing high-precision analog output, which is important for improving the quality of image display.

2. Description of Related Art

An image processing apparatus includes a digital-to-analog conversion circuit (hereinafter referred to as the "DAC") for converting digital image data having individual colors, such as red, green, and blue, into analog data to be displayed on, for example, a CRT or a liquid crystal display unit.

This DAC is provided with a constant-current generating circuit for generating a certain constant current based on a reference voltage. The constant-current generating circuit has a basic-capacitance transistor and a transistor having a channel width of a ratio which is an integral multiple of the width of the basic-capacitance transistor. By a combination of the above-mentioned two transistors, a constant-current generating circuit for use in a current-addition-type DAC is formed. The basic-capacitance transistor, and the transistor which is designed to have an integral multiple of the capacitance of the basic-capacitance transistor, are provided as one set for the constant-current generating circuit. By combining a plurality of this set, weights are assigned to multibit digital input data. In this manner, the current-addition-type DAC is formed by combining a plurality of sets of current generating transistors having a capacitance according to "bit-weighting".

FIG. 6 illustrates the layout of a conventional DAC having a plurality of sets of constant-current generating circuits, each having one basic-capacitance transistor and one transistor which is designed to have an integral multiple of the capacitance of the basic-capacitance transistor. Numeral 601 indicates a constant-current generating circuit having one set of the above transistors. FIG. 7 illustrates the layout of a constant-current generating circuit having one set of the above transistors for use in a conventional DAC.

For simple description, a constant-current generating circuit whose output capacitance is 1 and a constant-current generating circuit whose output capacitance is 8 will be taken as examples of the circuit configuration.

A conventional DAC, in particular, an analog circuit, is formed of, as illustrated in FIG. 6, the constant-current generating circuits 601 and an analog switch 602 which determines by digital input whether data is output or discarded (not output). The number of sets of constant-current generating circuits 601 is determined by the number of bits of digital input and, basically, three output channels, each channel having the configuration shown in FIG. 6, are provided so as to correspond to analog channels of the individual colors, such as R (red), G (green), and B (blue).

Hitherto, the peripheral portion of the constant-current generating circuit, which determines the precision of digital-to-analog conversion of the DAC, is always exposed and is placed adjacent to external MOS transistors, though this varies according to the layout of the surrounding MOS transistors.

However, the following problem occurs in the configuration layout of the constant-current generating circuit having one set of the transistor having a capacitance of 1 and the transistor having a capacitance of 8, as shown in FIG. 7. Although the size ratio of the two transistors is 1:8, the MOS transistor having a capacitance of 8 is vulnerable to variations generated in the device forming process. Thus, the uniformity of devices is not guaranteed.

In the constant-current generating circuit shown in FIG. 7, a source electrode 702, which serves as a current generating source, is used together with the adjacent constant-current generating transistor. Moreover, since the source electrode 702 itself is placed farther inward than the device, uniformity of the source resistance, which is one factor for stably generating a constant current, is achieved.

Concerning drain electrodes 701 for extracting an output current, however, some drain electrodes 701 are located farther inward than the corresponding constant-current generating transistors, and some drain electrodes 701 are placed farther outward than the corresponding constant-current generating transistors. Accordingly, variations of the drain capacitance, the drain resistance, etc., are produced. Such variations cannot be eliminated even by swapping the positions of the drains and sources shown in FIG. 7, thereby failing to achieve uniformity of the capacitance and the resistance.

Also, the MOS transistors located at the upper and lower edges are positioned at the peripheral portion of the constant-current generating circuit shown in FIG. 6. Thus, in particular, the distribution of the pattern density when gate electrodes are formed, which causes variations of the gate length, cannot be ignored.

This is because the distribution of the pattern density causes a loading effect in the gate-electrode forming process, which generates variations of the pattern dimensions after etching.

As discussed above, according to the conventional art, a constant current cannot be stably generated due to the following reasons.

1. The uniform formation of a pattern based on the basic-capacitance transistors cannot be achieved. That is, the drain resistance, the source resistance, and so on, are not consistent.

2. Since the peripheral portion is exposed, variations of the gate length and the threshold voltage (Vth) of the constant-current generating transistors are encouraged.

SUMMARY OF THE INVENTION

3. Even by combining a plurality of constant-current generating circuits, each having a set of transistors, positional uniformity cannot be achieved, thereby failing to stabilize a constant current within one channel.

In view of the above background, it is an object of the present invention to provide a circuit for stably generating constant current in a DAC for use in an image processing apparatus so as to implement high-precision output, which is important for the quality of image display.

A constant-current generating circuit of the present invention includes a plurality of current-generating transistors, each having a gate electrode controlled by a reference voltage, a source electrode connected to a current-generating source, and a drain electrode for extracting an output current generated by the reference voltage. The plurality of current-generating transistors are disposed in the form of a SEA OF GATES.

The SEA OF GATES (hereinafter referred to as "SOG") is a gate array having a structure in which transistors are mounted on the entire chip, and is also referred to as a channel-less type or a free channel. Normally, according to the SOG technique, random logic, such as a gate array, is formed by changing the pattern data of metal, contacts, and via-holes in the metal wiring process.

This technique offers the advantage of suppressing variations generated during the formation of devices, since transistors, which are individual basic devices, are arranged in a regular order. A current-addition-type DAC, such as the one of this invention, has a plurality of current-generating transistors. Accordingly, the circuit configuration can be established even by combining a plurality of basic-capacity transistors arranged in the form of the SOG. Thus, by utilizing the SOG technique for the constant-current generating circuit, the pattern of the basic-capacitance transistors can be made uniform, thereby obtaining a stable constant-current output.

According to the constant-current generating circuit of the present invention, the plurality of current-generating transistors may be disposed in an array, and dummy transistors, which do not form the current-generating transistors, may be disposed at a peripheral portion of the current-generating transistors.

Also in the present invention, at least one row or at least one column of the dummy transistors may preferably be disposed.

According to the above configuration of the present invention, the transistor devices forming the effective constant-current generating circuit can be prevented from being exposed, thereby suppressing variations of the gate length and Vth of the current-generating transistors. As a result, the characteristics of the plurality of current-generating transistors can be made uniform.

Moreover, in the present invention, the dummy transistors may preferably have the same wiring layer pattern as a wiring layer pattern for connecting the plurality of current-generating transistors.

With this arrangement, as in the formation of the uniform pattern in the transistor forming process, the uniform pattern can be made uniform in the wiring process. In the manufacturing process of a semiconductor apparatus, a so-called loading effect, is generated in which the distribution of the pattern density causes variations of the finished measurements while pattern etching is being performed by a photolithography method. The difference in the thickness of the wiring layer pattern causes a disparity of the resistance. Accordingly, in the present invention, for making at least the wiring layer of the effective portion uniform, the same wiring layer for the dummy portion as that for the effective portion is used. It is thus possible to eliminate the dimensional variations of the wiring layer pattern of the overall constant-current circuit, which would otherwise cause variations of the wiring resistance of the effective current-generating transistors.

In the present invention, the number of contacts of the source electrode may be equal to the number of contacts of the drain electrode of the current-generating transistors, and the contacts of the source electrode may be positioned to face the contacts of the drain electrode via the gate electrode.

According to the configuration of the present invention, the number of contacts of the source electrode is the same as that of the drain electrode, and the contacts of the source electrode and the drain electrodes are positioned to face each other. Consequently, the path over which the current flows via the channel can be consistent in a single current-generating transistor.

A digital-to-analog conversion circuit of the present invention includes: the aforementioned constant-current circuit, a first transistor in which an output current of the constant-current circuit is input into a source, a drain is grounded, and a first control signal corresponding to input digital data is connected to a gate; and a second transistor in which an output current of the constant-current circuit is input into a source, an analog value is output from a drain, and a second control signal, which is complementary to the above control signal, is connected to a gate.

According to the above configuration of the present invention, a stable constant current can be obtained, thereby making it possible to perform digital-to-analog conversion with high precision.

Further, an image processing apparatus of the present invention includes: the aforementioned digital-to-analog conversion circuit; and a display controller for supplying display image data to the digital-to-analog conversion circuit as digital data.

According to the image processing apparatus of the present invention, highly precise digital-to-analog conversion can be performed, thereby obtaining stable and high-quality image display.

DETAILED DESCRIPTION OF PREFERRED EMBODIMENTS

The present invention is described in detail below.

Figure 1:
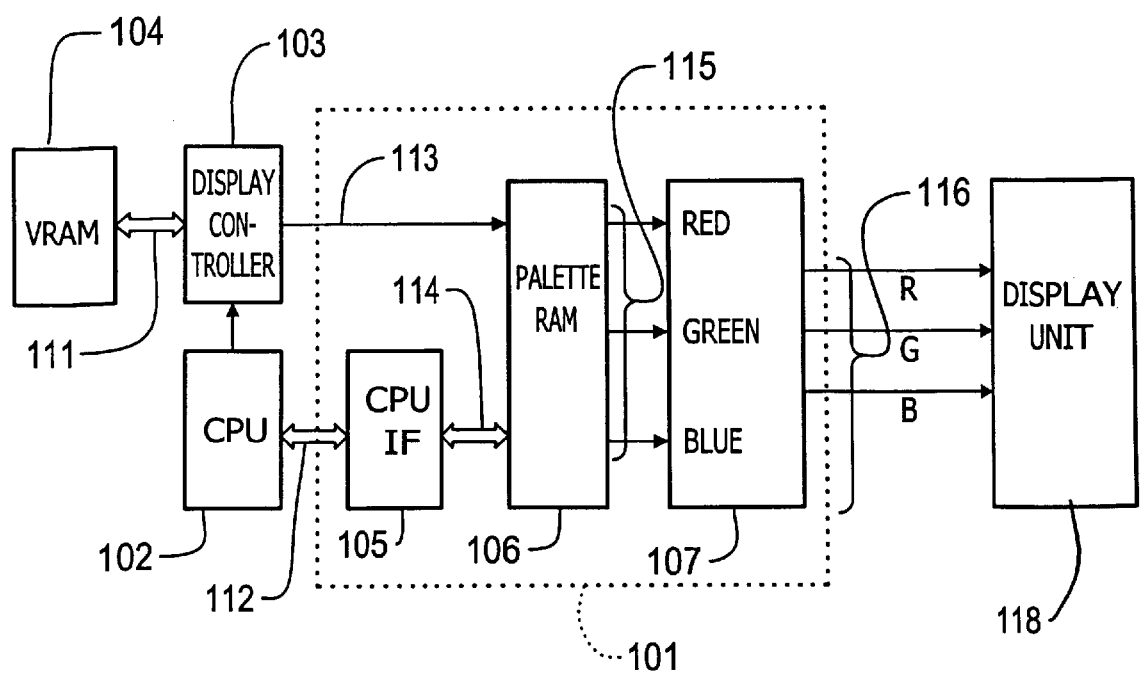
FIG. 1 is a block diagram illustrating an image processing apparatus of the present invention.
Figure 2A:
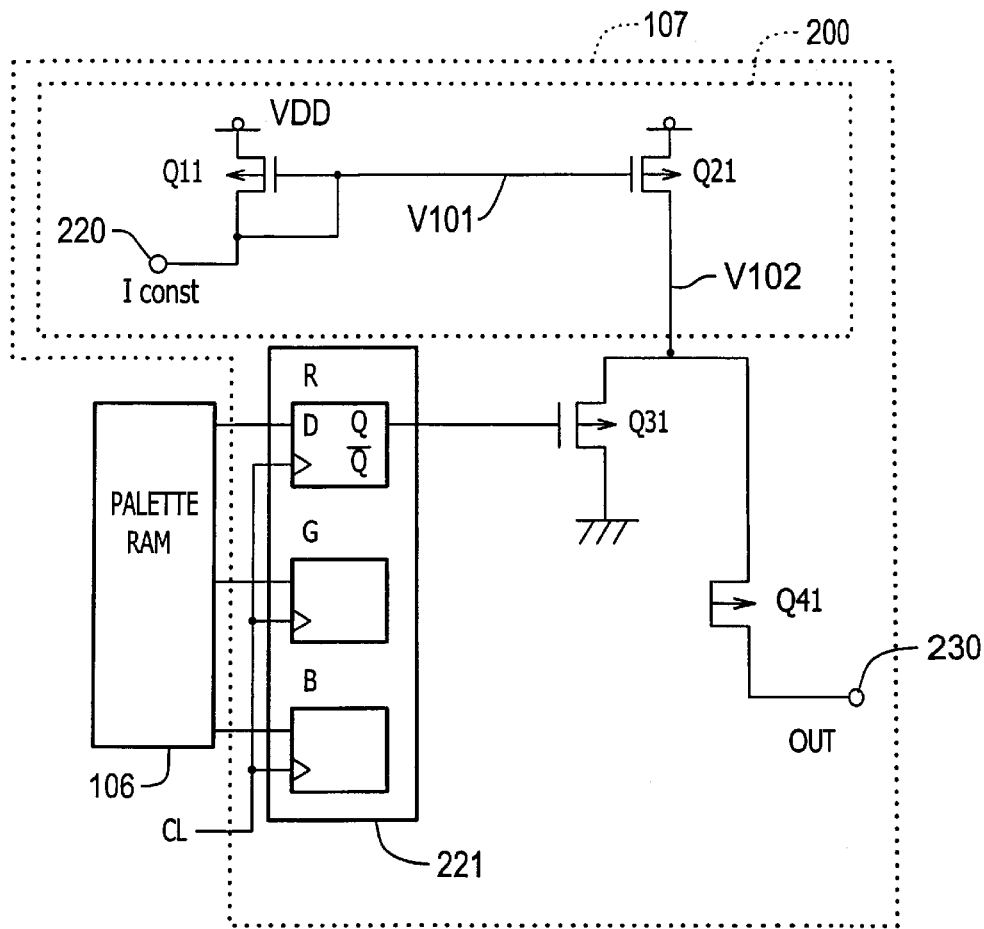
FIGS. 2(a)–(b) are schematic diagrams illustrating a digital-to-analog conversion circuit of the present invention.
Figure 2B:
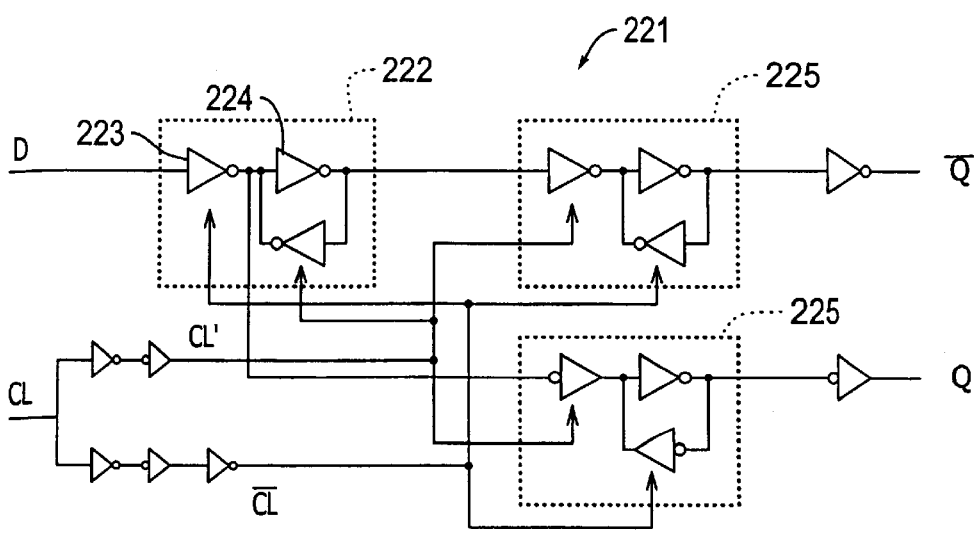

FIG. 1 is a block diagram illustrating an image processing apparatus including a digital-to-analog conversion circuit of the present invention. FIGS. 2(a)–(b) are schematic diagrams illustrating the digital-to-analog conversion circuit for use in the image processing apparatus shown in FIG. 1.

Reference is first made to the block diagram including a color palette 101 shown in FIG. 1. The portion surrounded by the dotted lines indicated by 101 shown in FIG. 1 is a color palette. A central processing unit (hereinafter referred to as the "CPU") 102 is connected to a CPU interface (CPUIF) 105 of the color palette via a bidirectional bus 112. A display controller 103 connected to a video RAM (VRAM) 104 via a bidirectional bus 111 forms, together with the CPU 102, a controller for supplying image data to a digital-to-analog conversion circuit, which will be described below. The display controller 103 is connected to a memory circuit, which is referred to as a palette RAM 106 of the color palette, with a signal line 113 for supplying color codes to the palette RAM 106. Digital color data 115 is supplied from the palette RAM 106 to a digital-to-analog conversion circuit 107. Analog RGB signals 116 are supplied from the digital-to-analog conversion circuit to a display unit 118, such as a CRT, a liquid crystal display unit, a projector, or the like.

In the operation of this system, the CPU 102 stores color data corresponding to the color codes in the memory circuit 5 of the palette RAM 106 via the CPU interface 105 within the color palette 101 during the vertical retrace period, during which data is not normally displayed on the screen. Then, while data is being displayed on the screen, the display controller 103 supplies the color codes to the color palette 101 according to the data from the VRAM 104 in synclronization with a pixel clock (which is a reference clock of the system, having a frequency divided by the number of dots (pixels) displayed on the CRT display during the horizontal display period). The color data corresponding to the color codes of the palette RAM 106 is supplied to the digital-to-analog conversion circuits 107 for Red, Green, and Blue, and is output as analog RGB signals from the color palette 101 to a display unit 118, such as a CRT or a liquid crystal display unit.

FIGS. 2(a)–(b) are a schematic diagrams illustrating part of the digital-to-analog conversion circuit 107 shown in FIG. 1.

When a clocked inverter 223 of a first latch circuit 222 in a flip-flop circuit 221 is on, the color data output from the palette RAM 106 passes through the first latch circuit 222. When the clocked inverter 223 is off, the color data is held in the first latch circuit 222. Two types of data, such as digital data in phase with the input data and digital data 180° out of phase with the input data, are obtained from this latch circuit 222.

As control signals for a set of constant-current sources and a selection circuit of the output current from the constant-current sources, which are formed by Q21, Q31, and Q41 of one of a plurality of constant-current generating circuits 200 for use in the digital-to-analog conversion circuit 107, the two types of data are connected to the gates of Q31 and Q41. The drain of Q31 is connected to a grounding power supply VSS, while the drain of Q41 is connected to an output OUT 230. Q21 is connected at its drain to the sources of Q31 and Q41, and at its gate to Iconst 220 supplied from a constant reference current source. Q11 is connected at its source to a power voltage VDD, and at its drain and gate to Iconst 220.

Figure 3:
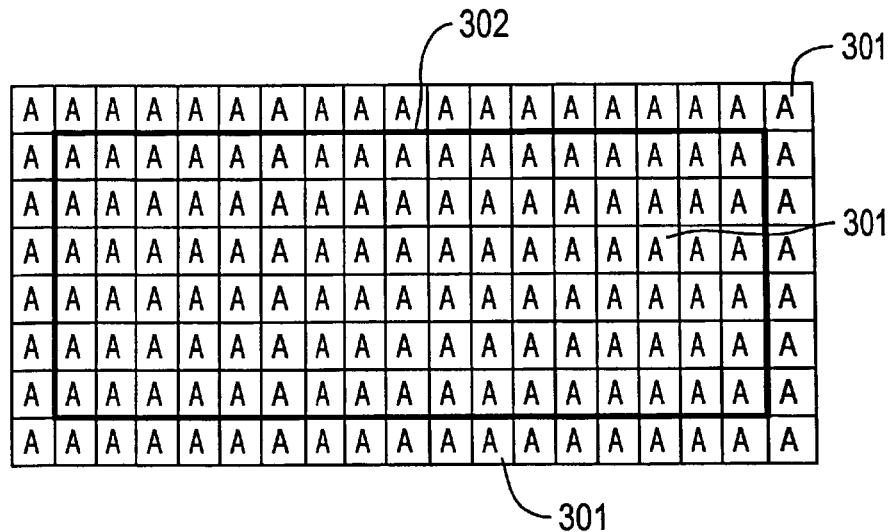
FIG. 3 illustrates the layout of a constant-current generating circuit according to the present invention.

The constant-current generating circuit 107 of this embodiment shown in FIGS. 2(a)–(b) is a differential input current mirror-type constant-current generating circuit. The Iconst value is externally set so that the gate voltage V201 of Q21 is equal to the drain voltage V202 of Q21 (V201= V202). Accordingly, the current at the output OUT 230 connected to the constant-current generating circuit 107 is determined by the switching of two complementary data, which are the input generating circuit of this embodiment. 301 indicates a current-generating transistor having a gate electrode controlled by a reference voltage, a source electrode connected to a current generating source, and a drain electrode that extracts an output current generated by the reference voltage. This current-generating transistor 301 is equivalent to one basic-capacitance transistor. In FIG. 3, the current-generating transistors 301 are positioned in the x and y directions in an array, i.e., in the form of a SEA OF GATES (SOG).

The portion surrounded by line 302 is a current-generating transistor group, which is for actual use.

In this embodiment, the current-generating transistors 301 (which form a constant-current generating circuit), which are for actual use, are positioned as a group, as shown in FIG. 3, for comparison with examples of the related art. However, the arrangement of the current-generating transistors 301 is determined by the required number of bits of digital input data and the size of the basic-capacitance transistors, and the effective portion within line 302 may be positioned as a group in any arrangement. Also, the numbers of transistor arrays in both the x and y directions are not limited.

Moreover, in this embodiment, a dummy portion is provided to surround the periphery of the effective portion within line 302.

The switching levels of Q31 and Q41 are set to be cross points of the rising and falling voltage waveforms of the two data, that is, the data in phase with the input data and the data 180° out of phase with the input data, thereby making it possible to match the on timing of Q31 and the off timing of Q41, and vice versa. Accordingly, the switching operation can be performed within a very short period of the on/on state, and the off/off state can be prevented, resulting in an output signal having a small glitch. Additionally, the transistor capacity can be made smaller than that when Q31 or Q41 is operated by applying a constant reference voltage to one of Q31 and Q41.

Q and inverted Q input into the gates of the switching transistors Q31 and Q41 may be reversed.

In this embodiment, the current-generating transistors Q11 and Q21 are regularly positioned in the form of an SOG so as to form a constant-current generating circuit 200. Consequently, the pattern can be uniformly formed based on the basic-capacity transistors, thereby achieving uniformity of all the factors of the constant-current generating circuits, such as the drain resistance, the source resistance, etc.

FIG. 3 illustrates the layout of the constant-current generating circuit of this embodiment. 301 indicates a current-generating transistor having a gate electrode controlled by a reference voltage, a source electrode connected to a current generating source, and a drain electrode that extracts an output current generated by the reference voltage. This current-generating transistor is equivalent to one basic-capacitance transistor. In FIG. 3, the current-generating transistors 301 are positioned in the x and y directions in an array, i.e., in the form of a SEA OF GATES (SOG).

Transistors forming this dummy portion have the same pattern as that of the basic-capacitance transistors 301 forming the effective portion within line 302. The numbers of columns and rows of the dummy portion are determined by the allowable area of a semiconductor chip into which the DAC is fabricated, and at least one column or at least one row is preferable. A dummy portion may also be provided within the effective portion within line 302.

Because of the provision of the dummy portion, the devices of the effective portion forming the constant-current generating circuit are not exposed, thereby inhibiting variations of the gate length and Vth of the current generating transistors 301.

The gap between the current-generating transistors 301 corresponding to the effective portion and the dummy portion arranged in the form of the SOG, i.e., the pitch therebetween, may be desirably set in consideration of the power supply wiring and the output current wiring as long as the design rules of the semiconductor chip are satisfied. Even by examining the device group of basic-capacitance transistors regularly arranged in the form of an SOG with a microscope before the wiring step, it is not possible to determine whether each device is used as an effective current-generating transistor or a dummy transistor. In this manner, in forming the device group of current-generating transistors including the dummy portion, the overall device group has a free pattern-density distribution. It is thus possible to prevent what is called the loading effect, in which the distribution of the pattern density causes variations of the finished measurements while pattern etching in being performed by a photolithography method. Therefore, the device group of current-generating transistors can be formed with uniform dimensional precision.

In the wiring process, as well as in the device forming process, the wiring pattern of the basic-capacitance transistors is used for all the effective constant-current generating circuits, thereby achieving the pattern uniformity of the wiring process. That is, all the source electrodes and the drain electrodes which are in use for the effective portion can be formed consistently from the device forming process to the wiring process.

It is desirable that the same wiring layer pattern as that for the effective portion be used for the circuit corresponding to the dummy portion.

By using the same wiring layer pattern for the dummy transistors as that for the effective current-generating transistors, the pattern can be uniformly formed in the wiring process, as well as in the device forming process. If the above-described loading effect is generated in the patterning of the wiring layer pattern, inconsistencies of the thickness of the wiring layer pattern cause a disparity in the resistance, resulting in variations in the individual current-generating transistors.

However, the patterning dimensional precision of the wiring layer at least for the effective portion is consistent. If the wiring layer of the dummy portion has the same pattern as that of the effective portion, the dimensional variations of the wiring layer pattern of the overall constant-current circuit can be eliminated, which would otherwise cause variations of the wiring resistance of the effective current-generating transistors.

The drain electrodes, which extract the output current, of the dummy portion may not be connected to an external block. If it is desired that the effective portion ranging from the current generating source to the drain electrodes is totally free of variations of the current density, the drain electrodes of the dummy portion are preferably connected to a power supply having a potential opposite to the current generating source.

Further, in making the pattern of the basic-capacitance transistors uniform, the symmetrical characteristic of the current-generating transistor 301 shown in FIG. 3 is an important factor.

A description is now given of the pattern configuration of the current-generating transistor that obtains a higher-precision precision output current.

Figure 4:
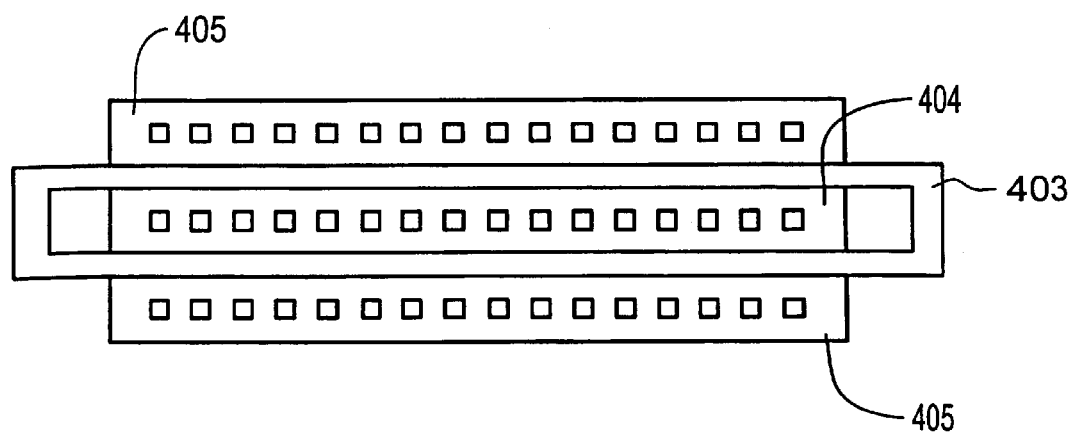
FIG. 4 illustrates the pattern configuration of a single current-generating transistor.

FIG. 4 is a schematic diagram illustrating the pattern of one current-generating transistor 301 shown in FIG. 3. Numeral 403 indicates a gate electrode of the constant-current generating circuit controlled by a reference voltage; 404 represents a drain electrode for extracting an output current; and 405 designates a source electrode connected to a current generating source. The gate electrode 403 is formed of two fingers.

An inner diffusion region 404, which is one half of the external diffusion region, is used as the drain electrode that extracts the current, thereby decreasing the junction capacitance at the diffusion layer. Accordingly, the transient response characteristics of the current output of the transistor are suitable for fast current output.

Figure 7:
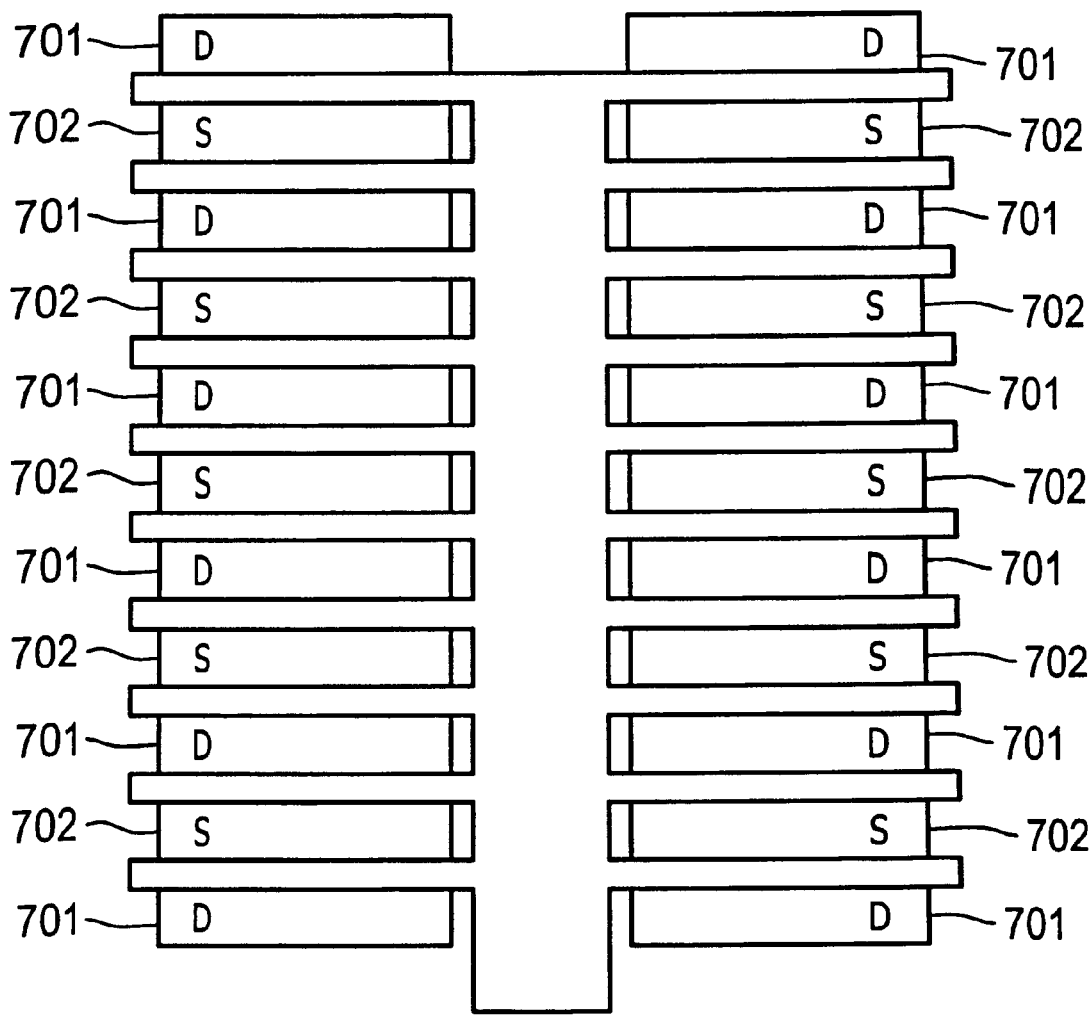
FIG. 7 illustrates the layout of one set of constant-current generating circuits for use in a conventional DAC.

The gate electrode 403 is connected at a local oxide film (LOCOS) region. Normally, the channel width W of the transistor of the constant-current generating circuit is formed large, thereby encouraging a potential difference in the gate electrode itself. However, by connecting the gate electrode, as shown in FIG. 4, variations of the gate bias voltage Vgs controlled by the reference voltage can be inhibited. In the constant-current generating circuit having one set of transistors for use in the digital-to-analog analog conversion circuit, such as the one shown in FIG. 7, the capacitance and the resistance are not consistent in the drain electrode or in the source electrode. In this embodiment, however, since the basic-capacitance transistor is completely separate, as shown in FIG. 4, it does not have to be used together with the adjacent constant-current circuit. Thus, the source-drain current path can be consistent among all the basic-capacitance transistors.

Moreover, in this embodiment, the number of contacts of the source electrode is set to be the same as that of the drain electrode, and the contacts of the source electrode and the drain electrode are positioned to face each other. This is particularly effective for a constant-current generating circuit having a large channel width W.

Generally, when flowing in a transistor, a current flows from a source contact to a drain contact via a channel. These contacts can be considered to be a type of resistor. In this embodiment, the number of contacts is the same between the source electrode and the drain electrode, and the contacts of the source electrode and the drain electrode are positioned to face each other. Accordingly, the path over which the current flows via the channel can be consistent in a single current-generating transistor.

Many contacts may be provided as long as the process design rules permit so as to reduce the resistances of the source electrode and the drain electrode, thereby making the impedance of the source-drain current paths uniform. By forming the pattern of the basic-capacitance transistor, as shown in FIG. 4, perfect symmetrical characteristics in the vertical and horizontal direction can be implemented.

Further, it is desirable to exhibit symmetrical characteristics not only for the source electrode and the drain electrode of a single current-generating transistor, but also for circuits, which are each formed of a plurality of the above-described transistors.

Then, the length and the thickness of the wiring pattern, the number of contacts, and the structure are determined to be uniform among the individual current-generating transistors, so that the resistances of the transistors can be the same. Thus, the output current values of the current-generating transistors can be substantially uniform.

Although in this embodiment, the electrode 405 is used as a source, and the electrode 404 is used as a drain, the electrode 405 may be used as a drain, and the electrode 404 may be used as a source.

A diffusion region for supplying a potential well or a diffusion region for preventing digital noise pickup may be safely disposed in the pattern configuration of this basic-capacitance transistor in the constant-current generating circuit. In this case, stable output current can also be obtained.

Although in this embodiment, the current-generating transistor is formed of one P-type MOS transistor, it may be formed by cascade-connecting P-type MOS transistors.

Figure 5A:
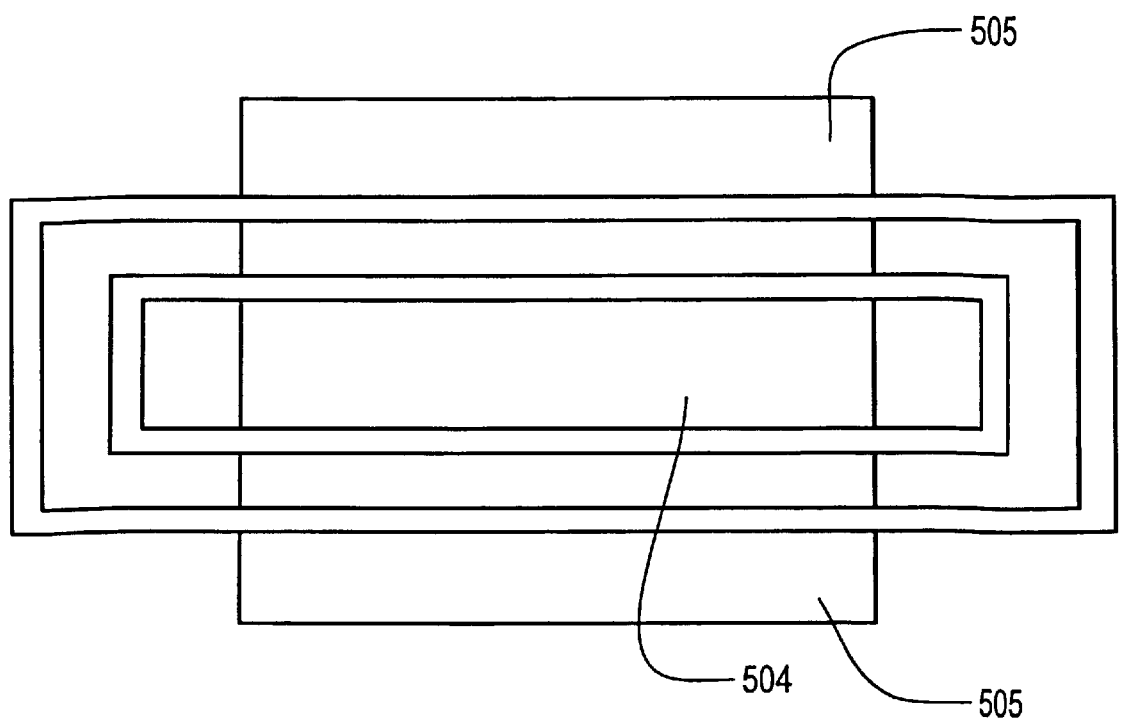
FIGS. 5(a)–(b) illustrate the layout of constant-current generating circuits according to the present invention.
Figure 5B:
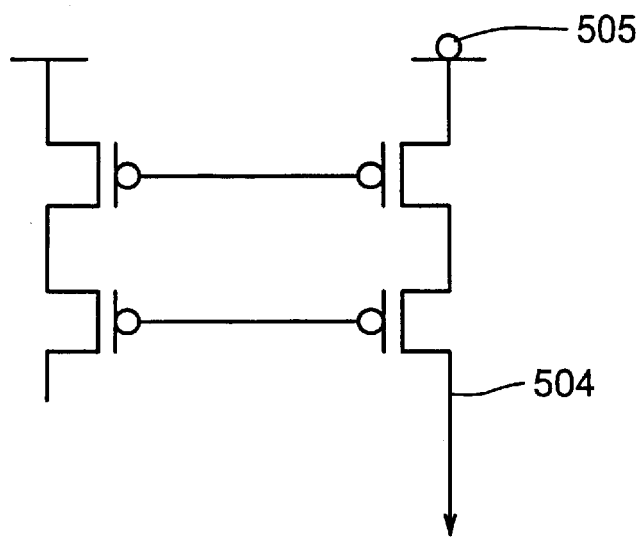
Figure 6:
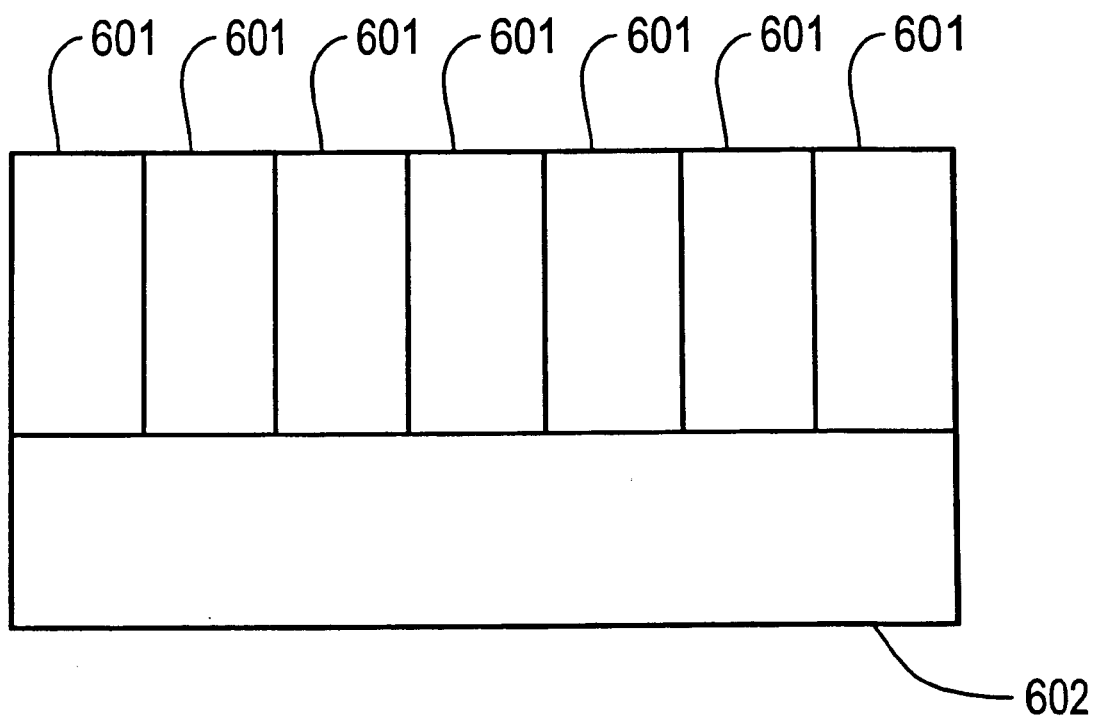
FIG. 6 illustrates the layout of constant-current generating circuits for use in a conventional DAC.

FIG. 5(A) illustrates the pattern configuration of cascade-connected P-type MOS transistors. FIG. 5(B) is a circuit diagram illustrating the cascade-connected P-type MOS transistors shown in FIG. 5(A).

As in the case of the current-generating transistor formed of a single P-type MOS transistor shown in FIG. 4, numeral 504 may be determined to be a drain electrode, while numeral 505 may be determined to be a source electrode. Alternatively, 504 may be set to be a source electrode, while 505 may be set to be a drain electrode.

The characteristics of the constant-current generating circuit formed by the pattern configuration shown in FIG. 4 in comparison with those of a conventional circuit system are as follows. Variations in the effective current output of a transistor having a capacitance of 8 relative to a transistor having a capacitance of 1 according to the conventional circuit system are 7.95±2%. In contrast, the variations resulting in this embodiment are 8.00±0.8%, obtaining the constant current value with very high precision.

As described above, according to the present invention, the current-generating transistors are regularly arranged in the form of an SOG, so that uniform pattern formation based on the basic-capacitance transistor can be achieved, thereby enabling all the factors of the constant-current generating circuits, such as the drain resistance, the source resistance, etc., to be uniform. Additionally, due to the provision of a dummy portion for at least one row or one column, devices which form the effective constant-current generating circuit are prevented from being exposed, thereby inhibiting variations of the gate length and Vth of the constant-current generating transistor.

Therefore, a constant current can be stably generated by the constant-current generating circuit of the present invention. The whole constant-current generating circuit forming the DAC becomes totally independent because of the arrangement of the constant-current generating transistors, thereby stabilizing the constant current within one channel.

As a result, digital-to-analog conversion can be performed with high precision, thereby achieving stable and high-quality image display.

The image processing apparatus of the present invention may be an electronic apparatus for outputting analog image signals, for example, a personal computer, or an electronic apparatus provided with a digital input terminal using a display device, such as a CRT, a liquid crystal display, or a plasma display.

The constant-current generating circuit of the present invention may be used, not only in a digital-to-analog conversion circuit or an image processing apparatus integrating a digital-to-analog conversion circuit, but also in a circuit which requires high-precision analog values, for example, a motor control circuit for driving a printer head.

Industrial Applicability

The present invention is best used in a digital-to-analog conversion circuit built in a fast video graphic controller for use in a digital television, a graphic display, etc., or a VGA-, SVGA-, or XGA-compatible video projector graphic controller.

What is claimed is:

1. A constant-current generating circuit comprising:

a plurality of current-generating transistors, each of said current-generating transistors having a gate electrode controlled by a reference voltage, the gate electrode formed in a shape of a rectangle that is open in a center portion, a source electrode connected to a current-generating source and a drain electrode that extracts an output current generated by said reference voltage, whereby contacts of the source electrode and contacts of the drain electrode are positioned to face each other and said plurality of current-generating transistors being disposed in a form of a SEA OF GATES.

2. The constant-current generating circuit according to claim 1, said plurality of current-generating transistors being disposed in an array, said constant-current generating circuit further comprising:

dummy transistors which do not form said current-generating transistors disposed at a peripheral portion of said current-generating transistors.

3. The constant-current circuit according to claim 2, said dummy transistors having at least one row or at least one column disposed.

4. The constant-current generating circuit according to claim 2, said dummy transistors having an identical wiring layer pattern as a wiring layer pattern for connecting said plurality of current-generating transistors.

5. The constant-current circuit according to claim 1, a number of contacts of said source electrode being equal to a number of contacts of said drain electrode of said current-generating transistors, and the contacts of said source electrode being positioned to face the contacts of said drain electrode via said gate electrode.

6. A digital-to-analog conversion circuit comprising:

the constant-current circuit set forth in claim 1;

a first transistor having a first source, a first drain and a first gate, an output current of said constant-current circuit being input into the first source, the first drain being grounded, and a first control signal corresponding to input digital data being connected to the first gate; and a second transistor having a second source, a second drain and a second gate, the output current of said constant-current circuit being input into the second source, an analog value being output from the second drain, and a second control signal complementary to said first control signal being connected to the second gate.

7. An image processing apparatus comprising:

the digital-to-analog conversion circuit set forth in claim 6; and a display controller that supplies display image data to said digital-to-analog conversion circuit as digital data.

* * * * *